United States Patent [19]
Dubin et al.

[11] Patent Number: 5,545,981
[45] Date of Patent: Aug. 13, 1996

[54] DEVICE FOR MEASUREMENT OF ELECTRICAL ENERGY COMPRISING A MULTIPLEXER

[75] Inventors: Michel Dubin, Poitiers; Jacques Talbot, Marigny-Brizay; Pierre Decaux, Chasseneuil du Poitou, all of France

[73] Assignee: Schlumberger Industries, S.A., Montrouge, France

[21] Appl. No.: 444,500

[22] Filed: May 19, 1995

[30] Foreign Application Priority Data

Jun. 1, 1994 [FR] France .................................. 94 06674

[51] Int. Cl.⁶ .................................................. G01R 21/06
[52] U.S. Cl. ................................................ 324/142; 364/483
[58] Field of Search .................................. 324/142, 141, 324/107; 364/483

[56] References Cited

U.S. PATENT DOCUMENTS

| | | | |
|---|---|---|---|
| 4,672,555 | 6/1987 | Hart et al. | 364/483 |
| 5,086,292 | 2/1992 | Johnson et al. | 324/110 |
| 5,168,459 | 12/1992 | Hiller | 364/724.19 |
| 5,229,713 | 7/1993 | Bullock et al. | 324/142 |

FOREIGN PATENT DOCUMENTS

| | | |
|---|---|---|
| 2357907 | 2/1978 | France . |
| 4221057 | 1/1994 | Germany . |
| 1575148 | 9/1980 | United Kingdom . |

*Primary Examiner*—Ernest F. Karlsen
*Attorney, Agent, or Firm*—K. G. W. Smith

[57] ABSTRACT

A device for measurement of electrical energy having current and voltage sensors 1, 2, a multiplexing circuit 8 and an analogue to digital converter 11. A microprocessor 9 controls the multiplexing circuit in order to supply the current and voltage signals alternately to the converter 11, the microprocessor 9 calculating the electrical energy at a moment in time using two values of the voltage situated around a current sample and using three samples of the current. By these means the time delay between samples of the voltage and current can be corrected.

9 Claims, 3 Drawing Sheets

DEVICE FOR MEASUREMENT OF ELECTRICAL ENERGY COMPRISING A MULTIPLEXER

The present invention concerns a device for measurement of electrical energy comprising a current sensor and a voltage sensor which supply respective current and voltage signals to a multiplexing circuit, the signals being then sent to an analogue to digital converter as per a sequential cycle of the signals.

In the field of measurement of electrical energy it is often the case that a single analogue to digital converter is used to convert signals arriving from several sensors, in order to reduce the cost asociated with the use of several converters. In order to do this a multiplexing circuit is used which controls the sequence in which the signals are sent from the sensor to the converter. Unfortunately, the multiplexing technique and the time necessary to convert each signal implies a time delay between the conversion of the values of the voltage signals and the current signals. This time delay can become significant if it is desired to calculate the instantaneous energy of an ac signal, since the current value which is measured then corresponds to a different point of the signal in comparison with the following value of the voltage that is measured. The problems associated with this time delay become more important if it is desired to measure the energy consumption on each phase of a multiphase network using a single converter, since the sampling cycle time will become longer.

In order to reduce this error one can simply reduce the time delay between the measurements by the use of a converter having a fast conversion time. Systems have also been proposed which compensate the time delay between measurements during a following calculation stage. In particular DE 4 221 057 describes a system which adds the product of a first voltage measurement and the following current measurement and the product of this current measurement and the next voltage measurement, the sum being corrected by a factor based on the frequency of the signal and the period of time between the samples. This system requires several multiplication steps between the voltage and current measurements, and does not calculate the instantaneous energy. Another example of an electricity meter having a multiplexing circuit with means for compensating for the time delay between current and voltage samples is described in GB 1 575 148.

The present invention is characterised by electronic control means which calculate the instantaneous electrical energy at the time of measurement of a first signal of current or voltage by a first step of calculating a value representing the first signal taken from the value of the first value sampled at this moment and by a second step of calculating a value representing the second signal taken from the values of the two samples of the second signal which are made before and after the moment in question, the first or second step of calculating the value of the first or second signal further using at least two other samples of that signal in order to calculate the value of that signal.

By the interlacing of the sampled values, the problems of time delay may be compensated in the calculation steps. Each sample value can be corrected by a coefficient, the value of which depends on the relative timing of the samples. In the case where the step of calculating the first signal uses three samples and the step of calculating the second signal uses two, the values of the coefficients of the first signal will be ½, 1, ½ for the samples taken before the moment in question, at the moment, and after the moment, respectively. Furthermore, the values relative to the coefficients of the second signal will be 1, 1. The use of coefficients for two signals having the same relative values results in the supply of the values of the first and second signal having the same relative amplitude.

Coefficients having these values are used when the alternating samples of each signal are equidistant in time. Differences can arise, for example, if there is a multiplexing cycle comprising other values to be converted, where the sample of one signal is not equidistant from the two neighbouring samples of the other signal. In this case, other coefficient values can be used to correct the time difference of the sampled values.

The introduction of a calculation step which uses at least three samples of a signal to calculate a value corresponding to this signal has specific advantages. In particular, this enables the definition of a comb decimation filter of three or more coefficients. For example, in the above described case a comb decimation filter having the coefficients ½, 1, ½ can be defined, the filter having a flat region of attenuation around a frequency corresponding to half the frequency between samples of this signal. In comparison, a decimation filter which only uses two coefficients defines an attenuation curve having a point corresponding to the maximum attenuation value.

In certain cases there may be other signals added to the voltage or current signals, for example, a dither signal, in order to improve the resolution of the converter. Following the known principals of this technique it is normally necessary to remove this dither signal after conversion of the signals. One way of doing this is by the injection of a dither signal having a frequency at a value close to half the sampling frequency of the signal being measured, the signal being removed after conversion using a decimation filter which attenuates signals at this frequency. In general, the dither signal has a frequency which is not exactly equal to half the sampling frequency and the use of a decimation filter with two coefficients and a single point of attenuation results in a small amount of the dither signal remaining. In comparison, the use of a decimation filter having at least three coefficients ensures that the dither signal will be more completely removed.

Thus, the present invention provides a system which compensates for the time delays between the voltage and current values and which is particularly adapted to be used with a dither signal in order to remove this signal after conversion. In one embodiment, the device further comprises means for adding a dither signal to the first signal having a frequency around half the sampling frequency of this signal.

In this context, a particularly advantageous embodiment uses a decimation filter with three coefficients defined by the first step of calculation and a decimation filter with two coefficients defined by the second step.

This embodiment is particularly advantageous for the complete suppression of the dither signal after conversion and avoids the problems of complexity of calculation associated with filters having more than three coefficients. Equally, the use of a filter having two coefficients for the other signal removes the time delay between the signals.

The present invention can be used in order to measure the electrical energy on a single phase. The present invention further applies to a device for measuring the electrical energy of a multiphase network, having a current sensor and a voltage sensor for each phase, the electronic control means and the multiplexing circuit functionning together in order to supply signals from each sensor to the converter in a sequential cycle, the control means calculating the instantaneous electrical energy for each phase as described above.

In the field of electricity metering, ripple control signals may be sent on the network which control the operation of the meter. In one embodiment, the multiplexing circuit comprises one input adapted to receive a ripple control signal, for example, for a ripple control receiver associated with one of the voltage sensors, this measurement being supplied to the the converter in the sequential cycle along with the other measurements.

In order to maintain the symmetry of the multiplexing cycle it is necessary to add another valaue in the cycle in addition to the value representing the ripple control signal so that the cycle comprises an even number of samples. In order to enable the removal of parasitic voltages due to the "memory" of components of the circuit, in particular the charges associted with the capacitors in the switching circuits, a voltage value equal to zero can be taken by this channel.

In one embodiment, the electronic control means controls the connection of another monitoring signal representing one or more monitored quantities to a channel of the multiplexing circuit at a frequency less than the sampling frequency of this channel in order that this channel is at zero for most of the time but receives intermittently the monitoring signal to be passed to the converter. By these means cancelling of parasitic voltages is achieved whilst the multiplexing circuit can pass information on the device from another source to the converter. For example, information concerning the opening of the meter box or the state of the power supply of the meter can be passed to the converter in response to a control signal arriving from the control means.

In view of the differences in amplitude possible between the voltage and current signals, in one preferred embodiment the zero signal and the monitoring signal are placed between the samples of voltage and the samples of current in the multiplexing cycle.

The invention will be best understand in the light of the following description of one embodiment of the invention given by way of an illustrative and non-limiting example and with reference to the annexed drawings in which.

Figure 1:
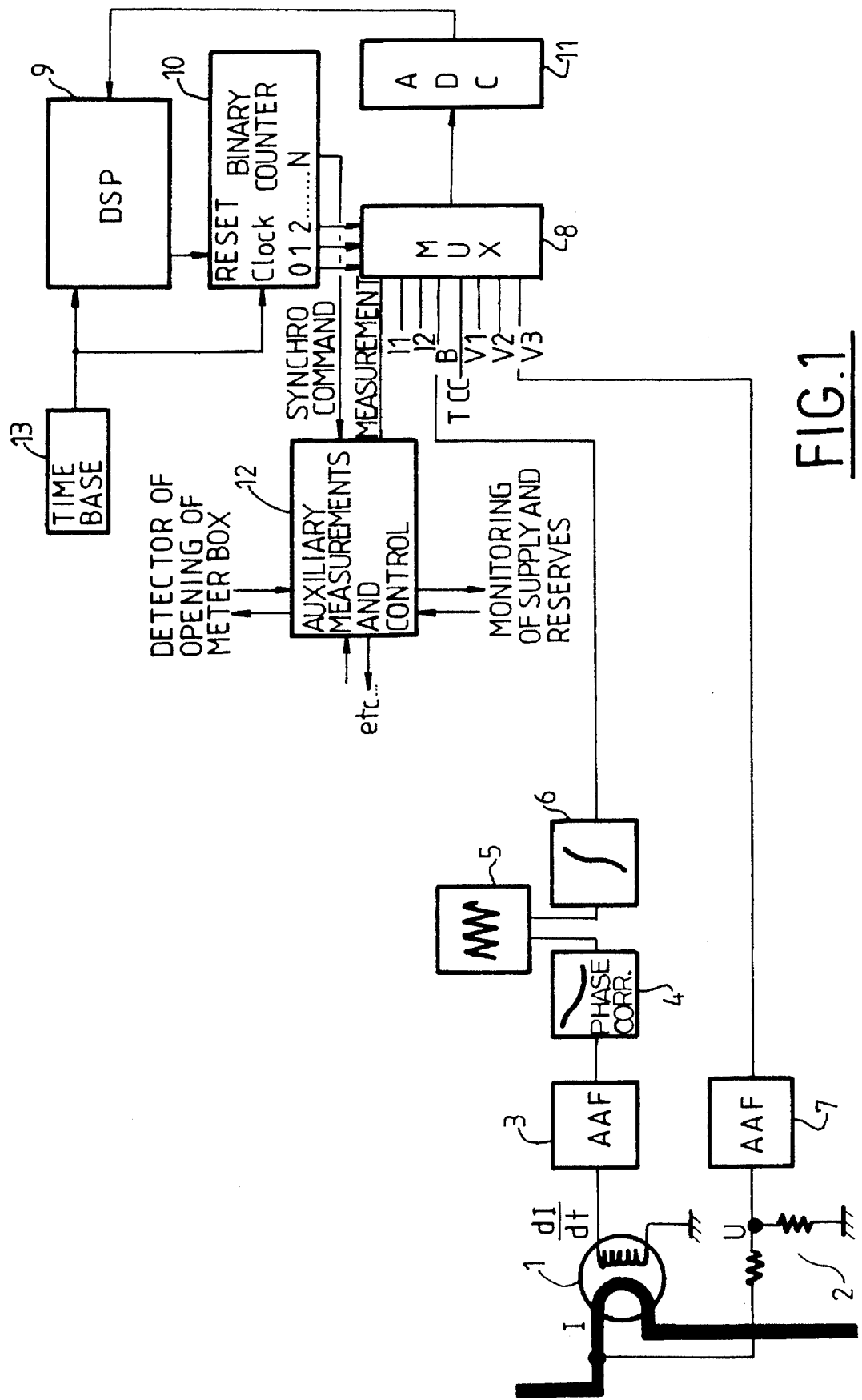
FIG. 1 shows a device for measurement of electrical energy for a three phase network as per an embodiment of the present invention.

FIG. 1 shows a device for measurement of electrical energy for a three phase network. For each phase there is a current sensor, comprising a mutual inductance transformer 1, and a voltage sensor, comprising a voltage divider 2. The current signal of the transformer is supplied to an analogue low pass filter 3 (anti-aliasing filter) followed by a phase corrector 4, which corrects phase differences remaining between the current and voltage channels. A dither circuit 5 adds a dither signal to the current signal, and an integrator 6 integrates the signals, this being necessary to the fact that the mutual inductance transformer supplies a signal representing the derivative of the measure current. The voltage signal is also supplied to a low pass filter 7, and the voltage and current signals are then supplied to the inputs I3, V3 of a multiplexer 8. The elements of the input circuits of each channel are repeated for each phase and are not shown here. The signals to the inputs of the multiplexer 8 are sent to an analogue to digital converter 11, in a sequential cycle controlled by the multiplexer 8 and by an electronic control means comprising a microprocessor 9 and a binary counter 10. The multiplexer further receives ripple control signals TCC of a ripple control circuit, of a conventional construction, and a monitoring signal from a monitoring circuit 12. The monitoring circuit 12 receives signals from devices which detect the opening of the meter box, the state of the power supply to the meter etc. and which supply information on their state. The signals output from the multiplexer are then converted into digital values by the converter 11 and sent to the microprocessor 9 for evaluation.

The control of the multiplexage of the signals is carried out using a clock 13 which serves as a time base and which increments the binary counter 10 and drives the microprocessor 9. The channel selected by the multiplexer 8 is addressed by the state of the outputs 1, 2, 4 of the binary counter 10, with a cycle of eight positions. The channel selected is then immediately converted by the converter 11. The output of the monitoring circuit 12 is at zero if this circuit does not receive a command from the binary counter 10. The microprocesor 9 periodically synchronises the binary counter by reset signal, its internal counter permitting it to know which channel is selected at a given moment. Normally, the microprocessor synchronises the counter at the end of each cycle of eight measurements. However, at predetermined times it stops sending a reset signal and the output N of the binary counter can then pass to a value 1, in order to send a signal to activate the monitoring circuit 12 and to start one or more measurement cycles on the monitoring channel. When these measurements are finished the microprocessor will restart the sending of reset signals.

As described, for most of the time the microprocessor resets the counter at the end of a cycle of eight measurements, the monitoring channel being thus reserved to measurements or control signals carried out at a relatively low frequency compared with the sampling frequency defined by the clock signals. The channel is thus normally at a potential of zero volts in order to permit a better transition between positon 7, representing the last voltage sample V3, and the position 1, representing the first sampling of the current I1. Between these two positions the channel imposes a potential of zero volts in order to cancel parasitic voltages caused by the capacitances and the "memory" of the switching circuits. The monitoring ciricuit is thus put into operation and synchronised by the output N of the binary counter, at a frequency being a sub-multiple of the sampling frequency, dependant on N, and at moments chosen by the microprocessor, giving an architecture which is flexible and easy to parametrise.

Figure 2:
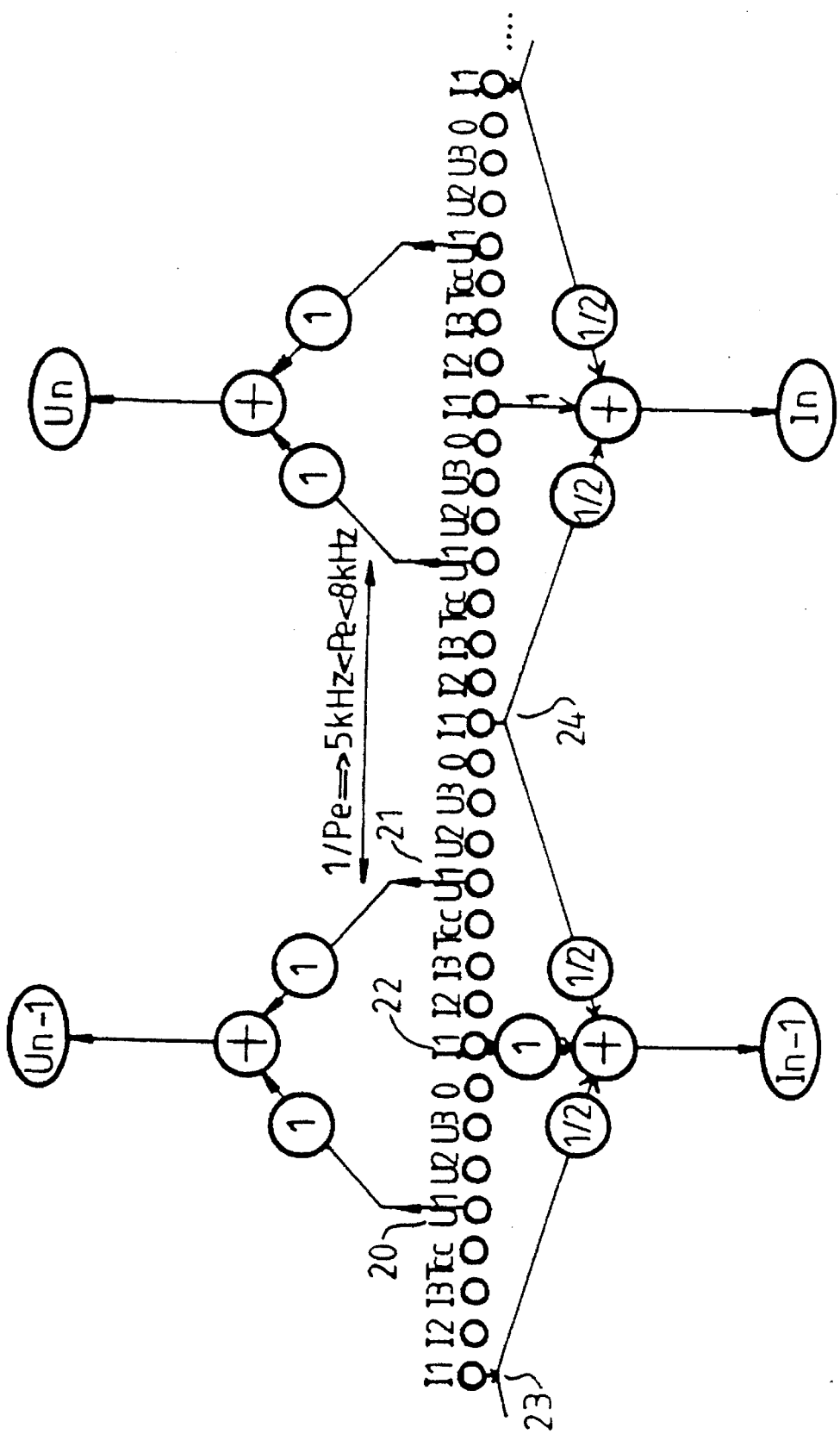
FIG. 2 shows the multiplexing cycle and the processing of samples carried out by the device of FIG. 1.

FIG. 2 represents a numerical treatment of samples of a single voltage phase and current phase in a multiplexing cycle. As is shown, the time delay between a voltage measurement U1 and a current measurement I1 is compensated by a voltage calculation step which sums the two voltage values 20, 21 sampled around the current value 22, and a current calculation step which sums the value of current 22 with the two current values 23, 24 around this value. Since the frequency of sampling between two measurements is much greater than the frequency of the ac signal which is measured such that there is a linear relation between a sequence of measurements, a representation of the voltage at the moment corresponding to the sampling of the current 22 can be calculated using the two voltage measurements 20, 21 multiplied by the relative coefficients 1,1. A sampling frequency typically used is between 5 kHz and 8 kHz for an ac signal of 50 Hz. By this interlacing technique, the problems of the delay between measurements of voltage and current are thus overcome.

Even if it is possible to calculate an instantaneous energy value using the voltage value calculated and the single value of current sampled at the moment 22, it is preferable to calculate the value of the current using three current samples, multiplied by the relative coefficients ½, 1, ½. This calculation maintains the relative proportion between the values of voltage and current and gives rise to the advantages associated with the digital filter which is defined by this calculation.

Figure 3:
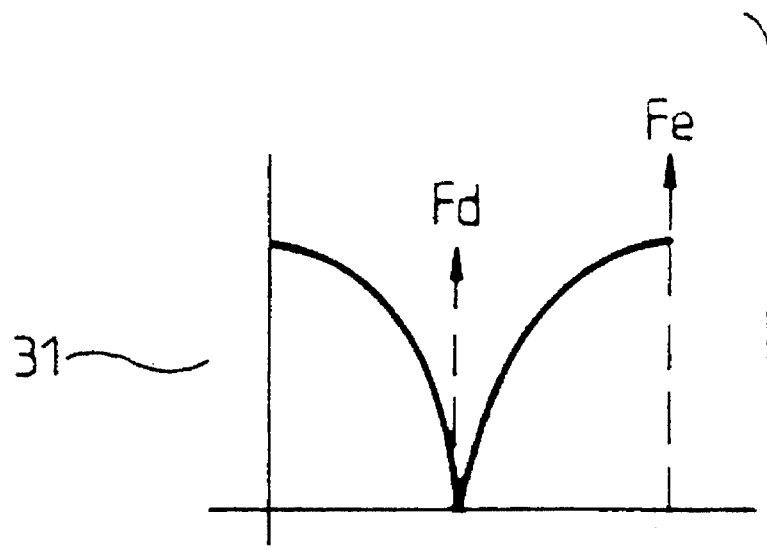
FIG. 3 shows two curves representing the behaviour of decimation filters having two and three coefficients defined by the processing of samples shown in FIG. 2.
Figure 3:
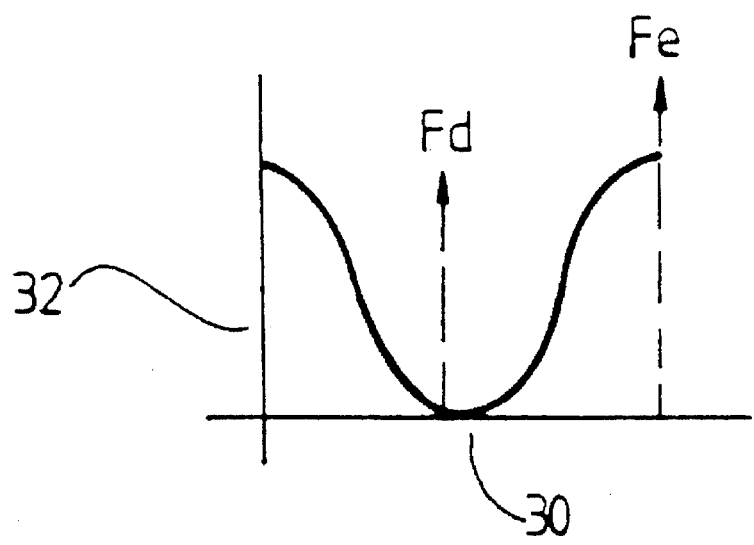

Referring to FIG. 3, the first curve 31 shows the filter response defined by the treatment of the voltage samples. Specifically, a filter having a gain in cos (f) is defined by the operation:

$$Y_n = X_{n-1} + X_n$$

This filter has a zero at a point corresponding to half of the sampling frequency and the behaviour of this filter is shown in the upper part of FIG. 3.

In comparison, the filter defined by the treatment of current samples as per the operation $$Y_n = X_{n-2}/2 + X_{n-1} + X_n/2$$

has the form 32 shown below in FIG. 3, that is, a gain in $\cos^2$ (f), where there is a flat region 30 at a frequency of half the sampling frequency which defines the maximum attenuation region of the signals. Other filters having four or more coefficients can be equally used in order to give a flat attenuation region. The advantages of a filter of this type are associated with the use of a dither signal added to the current measurement in order to impose the resolution of the converter.

Referring to FIG. 1, an antialiasing filter 3 having a cut-off frequency corresponding to half the sampling frequency is shown after the current sensor 1. A dither signal is then added to the current signal having a frequency which is around the cut-off frequency. A typical dither signal has the form of a triangular wave having an amplitude corresponding to several quantisation steps. In the present embodiment, the dither circuit is upstream of an integrator 6 and a square wave signal is added which becomes a triangular signal after integration.

After the conversion of the current signal, the dither signal should be removed. In one embodiment this can be done using a decimation filter of the type used for the voltage signals, that is, a filter with two coefficients. As shown in FIG. 3, the dither signal will be attenuated by this filter. However, given that this filter has a zero at only one point and that the dither signal is generally not exactly half the sampling frequency, there will be a part of the dither signal which remains after filtering.

In comparison, a decimation filter having three or more coefficients, that is, a filter of the type described above for the current channel, defines a curve of the type shown below in FIG. 3 and having a flat region around half the sampling frequency. Thus, the dither signal is completely suppressed by this filter.

By these measns, the present invention compensates for the delays between samples of voltage and current and further enables suppression of the dither signal at the current channel.

We claim:

1. Device for measurement of electrical energy comprising a current sensor and a voltage sensor which supply respectively current and voltage signals to a multiplexing circuit, the signals then being sent to an analogue to digital converter in a sequential cycle of signals, the device comprising electronic control means which calculate the instantaneous electrical energy at the time of measurement of a first signal, being either a current or voltage signal by (i) a first step of calculating a value representing the first signal taken from the value of the first signal sampled at this moment and by (ii) a second step of calculating a value representing the second signal taken from the values of the two samples of the second signal which are made before and after the moment in question, the electronic control means calculating the first or second step further using at least two other samples of the signal in question in order to calculate the value of that signal, such that either the first or the second signal is calculated using at least three samples of that signal.

2. Device for measurement of electrical energy as per claim 1, in which the step of calculation of the first signal uses two other samples of the first signal.

3. Device for measurement of electrical energy as per claim 2, in which the values of the samples of the first signal are multiplied by coefficients having the relative values ½, 1, ½ for the samples taken before the moment in question, at this moment, and after this moment, respectively.

4. Device for measurement of electrical energy as per claim 3, in which the values of the samples of the second signal are multiplied by coefficients having the relative values 1, 1.

5. Device for measurement of electrical energy as per claim 4, further comprising means for adding a dither signal to the first signal having a frequency of around half the sampling frequency of the signal.

6. Device for measurement of electrical energy as per claim 5 adapted to measure the electrical energy in each phase of a multiphase network and having a current sensor and a voltage sensor for each phase, the control means and the multiplexing ciricuit operating together to supply the signals from each sensor to the converter in a sequential cycle.

7. Device for measurement of electrical energy as per claim 6, the multiplexing circuit comprising one input adapted to receive a ripple control signal, this measurement being supplied to the converter in the sequential cycle with the other measurements.

8. Device for measurement of electrical energy as per claim 7, the electronic control means controlling the connection of another signal representing one or more monitored quantities to one channel of the multiplexing circuit, this channel being otherwise at zero, the frequency of the connection of the monitoring signal to this channel being less than the frequency of sampling of this channel so that this channel is at zero most of the time but intermittently receives the monitoring signal.

9. Method for measurement of electrical energy using a current sensor and a voltage sensor which supply respectively current and voltage signals to a multiplexing circuit, the signals then being sent to an analogue to digital converter in a sequential cycle of signals, characterised in that the instantaneous electrical energy at the moment of sampling of a first signal representing the current or voltage signal is calculated using a first step of calculating a value representing the first signal taken from the value of the first value sampled at this moment and by a second step of calculating a value representing the second signal taken from the values of ther two samples of the second signal which are made before and after the moment in question, the first or second step of calculating the value of the first or second signal further using at least two other samples of that signal in order to calculate the value of that signal.

* * * * *